United States Patent
Aunet (10) Patent No.: US 7,288,968 B2
(45) Date of Patent: Oct. 30, 2007

(54) CIRCUIT ELEMENT

(75) Inventor: Snorre Aunet, Trondheim (NO)

(73) Assignee: Leiv Eiriksson Nyskaping AS, Trondhom (NO)

(*) Notice: Subject to any disclaimer, the term of this patent is extended or adjusted under 35 U.S.C. 154(b) by 0 days.

(21) Appl. No.: 10/581,740

(22) PCT Filed: Dec. 10, 2004

(86) PCT No.: PCT/NO2004/000381

§ 371 (c)(1),
(2), (4) Date: Jun. 8, 2006

(87) PCT Pub. No.: WO2005/057789

PCT Pub. Date: Jun. 23, 2005

(65) Prior Publication Data

US 2007/0115029 A1    May 24, 2007

(30) Foreign Application Priority Data

Dec. 11, 2003 (NO) .................................. 20035537

(51) Int. Cl.
*H03K 19/094* (2006.01)
*H03K 19/0175* (2006.01)

(52) U.S. Cl. ........................ 326/87; 326/119; 326/121
(58) Field of Classification Search ................. 326/87, 326/112, 119, 121; 327/534–535, 537
See application file for complete search history.

(56) References Cited

U.S. PATENT DOCUMENTS 6,232,793 B1 * 5/2001 Arimoto et al. ............... 326/34
2005/0162212 A1 * 7/2005 Sakiyama et al. ........... 327/534

* cited by examiner

*Primary Examiner*—Anh Q. Tran
(74) *Attorney, Agent, or Firm*—Dennison, Schultz & MacDonald (57) ABSTRACT

A circuit element comprising N paired complementary transistors. The transistors are connected to an upper ($V_{DD}$) and lower voltage level ($V_{SS}$), in such a way that the paired transistors operate in subthreshold. N input terminals ($X_1$, $X_2 \ldots X_N$) are connected to the respective paired transistors. Control terminals (BP, BN) are connected to control input nodes of the transistors. The circuit element provides the possibility of real time configuration between various logic functions with a minimum of transistors and wiring.

5 Claims, 6 Drawing Sheets

CIRCUIT ELEMENT

This application is a filing under 35 USC 371 of PCT/NO02004/000381, filed Dec. 10, 2004.

The present invention relates to a circuit element according to the introductory part of claim 1. The circuit element has a relatively low power consumption, and will be particularly suitable for general ultra-low power consumption applications, like niches such as space technology, biological implants, and neuromorphic electronics. However, the application of the circuit element is not restricted to such niches.

BACKGROUND

Digital systems are used for a range of different purposes when it comes to processing and calculation of data, such as in control systems, communication systems, and measuring systems. Digital circuits use discreet signals, which are usually binary, i.e. only two values are used. The advantage with this is that the reliability with regard to errors is good, ensuring that the circuits are accurate.

Analog systems use analog signals, which vary continously within a range. Thus analog systems are more vulnerable to errors.

Digital systems normally comprise a central processing unit (CPU) that executes arithmetic functions (for instance addition, subtraction, and division), and logic functions (for instance AND, OR, NAND, NOR, and NOT). The arithmetic and logic functions are executed by a number of logic gates, or circuit elements, which are interconnected, and form a network with multiple logic depths. The logic circuit elements normally include one or more inputs, and an output. The number of inputs are described as the "fan-in" of the circuit element. Usually, AND denotes the logic function AND with two inputs, whereas AND3 denotes the same function with three inputs. The notation "'" denotes inversion.

When designing circuits, a range of considerations must be taken into account, particularly with regard to the requirements of the application. The circuit elements include, for example, different types of transistors, capacitors, and resistors, which are selected with regard to these requirements.

CMOS-transistors are devices with four nodes or electrodes, namely the source, drain, gate, and well. In this context, two types of such transistors exist, p-channel MOSFET transistors and n-channel MOSFET transistors. In most applications of such transistors, the well is connected to the source.

Within the development of processor units, there is a large focus on speed. As the speed of the processor units increase, so does the power requirement and the operating temperature. Processing units are used, for example, in laptop computers, where the power consumption should not be too great in relation to the battery capacity.

In a range of other applications, the power consumption is far more important than the speed. This applies to space technology, units for biological implants, neuromorph electronics, and nano technology, for instance. In neuromorph electronics, such as electric circuits that model or simulate neural networks, both digital and analog signals are often used in the inputs and the outputs of the circuits.

It is known to reduce the operating voltage in electric circuits, so that the transistors operate in what is called subthreshold, or weak inversion. From the paper "*Robust Ultra-Low Power Sub-threshold DTMOS Logic*", Soeleman, H., Roy, K. and Paul, B., ISLPED 2000, Rapallo, Italy, it is known that operation in this area results in a significant reduction in power consumption. However, a consequence is that the circuit becomes slower, compared to the classic operation area.

Threshold logic uses discreet signals with two or more values. For instance, ternary logic uses three values on the output, whereas quaternary logic uses four. Threshold logic can also have multiple discreet levels on the input signals, while the output signal is binary, i.e. logic 0 or 1.

The following formula yields the sign f of the weighted sum of a series of inputs $x_1 \ldots x_n$:

$$f(x_1, \ldots, x_n) = \mathrm{sgn}\left(\sum_{i=1}^{n} \omega_i x_i - \theta\right) \qquad [1]$$

where $\omega_i$ denotes the weight of the input $x_i$, $\theta$ denotes the threshold value, and n denotes the number of inputs, or fan-in. This is known from Beiu et al., mentioned below.

It is known that circuit elements, which use threshold logic, may reduce the number of transistors and the amount of wiring. This reduces the chip area, which results in a reduction in the production costs.

The paper "*VLSI Implementations of Threshold Logic—A Comprehensive Survey*", Beiu, Valeriu et al, IEEE Transactions on neural networks, vol. 14, No. 5. September 2003 provides an historical overview of the technical developments in the field of threshold logic. Here, U.S. Pat. No. 3,715,603 is mentioned, which describes a majority-minority circuit element, which is achieved with six transistors. This will function as a logic NOR2 or a logic NAND2 circuit element. The drawback with this circuit is that an inverter is required to amplify the signal before the output.

Object

The main object of the present invention is to provide a logic circuit element with very low power consumption. The circuit element shall contain very few transistors and very little wiring.

An additional object is that the function of the circuit element shall be reconfigurable in real time.

The Invention

The present invention is indicated in the characterizing part of claim 1. An additional aspect of the invention is indicated in the characterizing part of claim 5. Further embodiments appear from the dependent claims.

In the following example of embodiment, MOS transistors are used. However, the invention should not be restricted to the use of MOS transistors. Transistor units in general may also be used. With transistor unit is meant any device having the possibility of controlling the current and/or voltage characteristics between nodes of the unit, by applying voltage and/or current to an additional node. In the circuit element according to the invention, the transistor units have at least four nodes. Such a unit can be a MOS-transistor with the nodes DRAIN, SOURCE, GATE, and WELL.

EXAMPLE

The present invention will be described in the following, with reference to the accompanying drawings, where.

Figure 1:
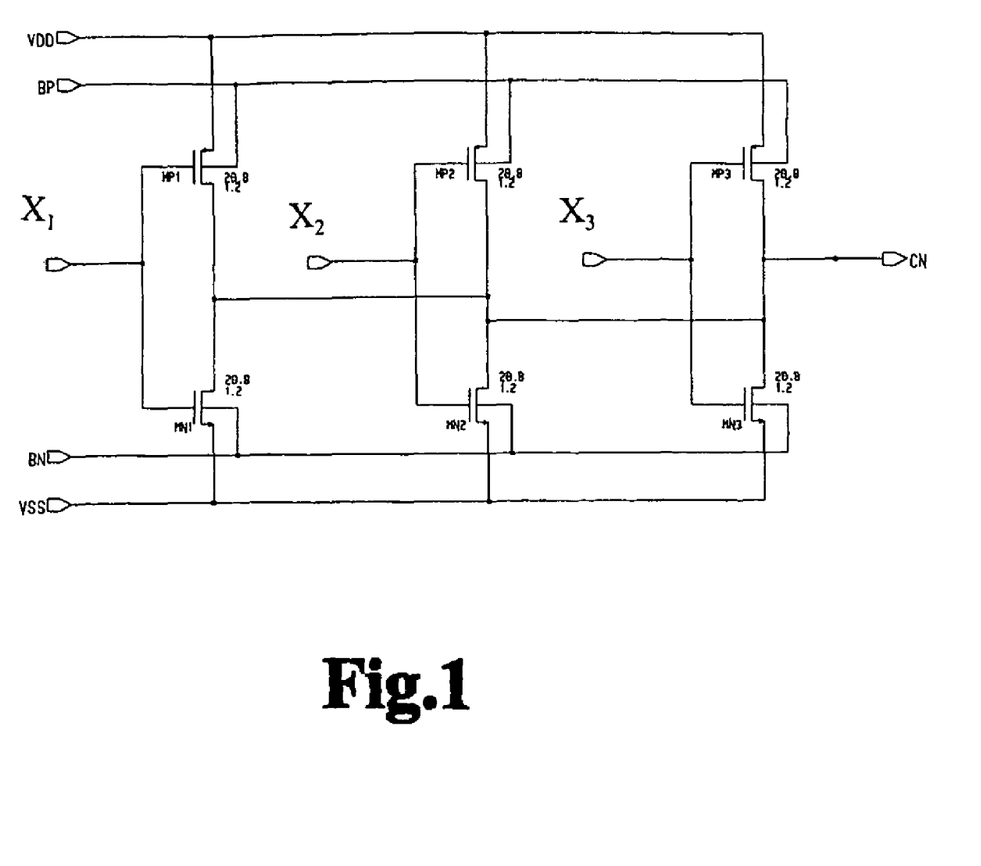
FIG. 1 illustrates a circuit diagram of an embodiment of the circuit element according to the invention.

FIG. 1 illustrates an embodiment of the invention. Here, the circuit element comprises N=3 pairs of transistors, but N can vary from N=2 upwards. There is one pair of transistors per input terminal, which means that N also denotes the number of input terminals. If a digital output signal shall be used, the delays in the circuit element will limit the number of input terminals.

Each pair of transistors comprises an NMOS transistor MN, and a PMOS transistor MP. The first pair of transistors comprises the NMOS transistor MN, and the PMOS transistor $MP_1$, the second pair comprises the NMOS transistor $MN_2$ and the PMOS transistor $MP_2$, whereas the third pair of transistors comprises the NMOS transistor $MN_3$ and the PMOS transistor $MP_3$. In this embodiment, the transistors are devices with four nodes or electrodes, namely source, drain, gate, and well. The drain node of the NMOS transistor MN is connected to the drain node of the PMOS transistor MP. Furthermore, the drain terminal of the first pair of transistors is connected to the drain terminal of the second pair of transistors, which in turn is connected to the drain terminal of the third pair of transistors.

The source node of the NMOS transistor is connected to a lower voltage level $V_{SS}$, which is typically earth or 0 V. The source node of the PMOS transistor is connected to an upper voltage level $V_{DD}$. The supply voltage in many of the standard CMOS integrated circuits of today is 3.3 V. The voltage level $V_{DD}$ will therefore typically be less than 1 V, so that the transistors operate in subthreshold, or weak inversion.

The circuit element further comprises N=3 input terminals $X_1$, $X_2$ and $X_3$. The input terminal $X_1$ is connected both to the gate node of the PMOS transistor $MP_1$, and to the gate node of the NMOS transistor $MN_1$, whereas the input terminal $X_2$ is connected both to the gate node of the PMOS transistor $MP_2$, and to the gate node of the NMOS transistor $MN_2$, and the input terminal $X_3$ is likewise connected both to the gate node of the PMOS transistor $MP_3$, and to the gate node of the NMOS transistor $MN_3$.

Furthermore, the circuit element comprises an output terminal CN, which is connected to the drain node of the PMOS transistor $MP_3$ and to the drain terminal of the NMOS transistor $MN_3$. Off course, the output terminal CN may be connected to any of the drain nodes of the transistor pairs.

The circuit element also comprises a control terminal BN connected to the well nodes of the NMOS transistors $MN_1$, $MN_2$, and $MN_3$, and a control terminal BP, connected to the well nodes of the PMOS transistors $MP_1$, $MP_2$, and $MP_3$.

This circuit element has a range of applications, of which some will be described in further detail by means of the following examples:

Example 1

The Circuit Element as Logic NAND3, NOR3, or CARRY'

The following example is described with reference to FIG. 1. In this example, the voltage levels of the terminals $V_{SS}$ and BN are 0 V, and the voltage of the terminal $V_{DD}$ is 0.7 V. This implies that the transistors operate in the sub-threshold area. By varying the voltage level of the control terminal BP, the voltage level of the output terminal CN is simulated for different logic voltage levels on the input terminals $X_1$, $X_2$, $X_3$.

In this example, as both of the terminals $V_{SS}$ and BN are 0 V, the control terminal BN could be omitted. Also, instead of controlling the logic function with BP, the terminal BP could be omitted, and the circuit could be controlled with BN. The well node of the PMOS-transistors would then normally be connected to the source nodes. One could also imagine controlling the circuit with the control terminals BN and BP short circuited. Furthermore, both of the terminals BN and BP could be used simultaneously to control the function of the circuit.

Figure 3:
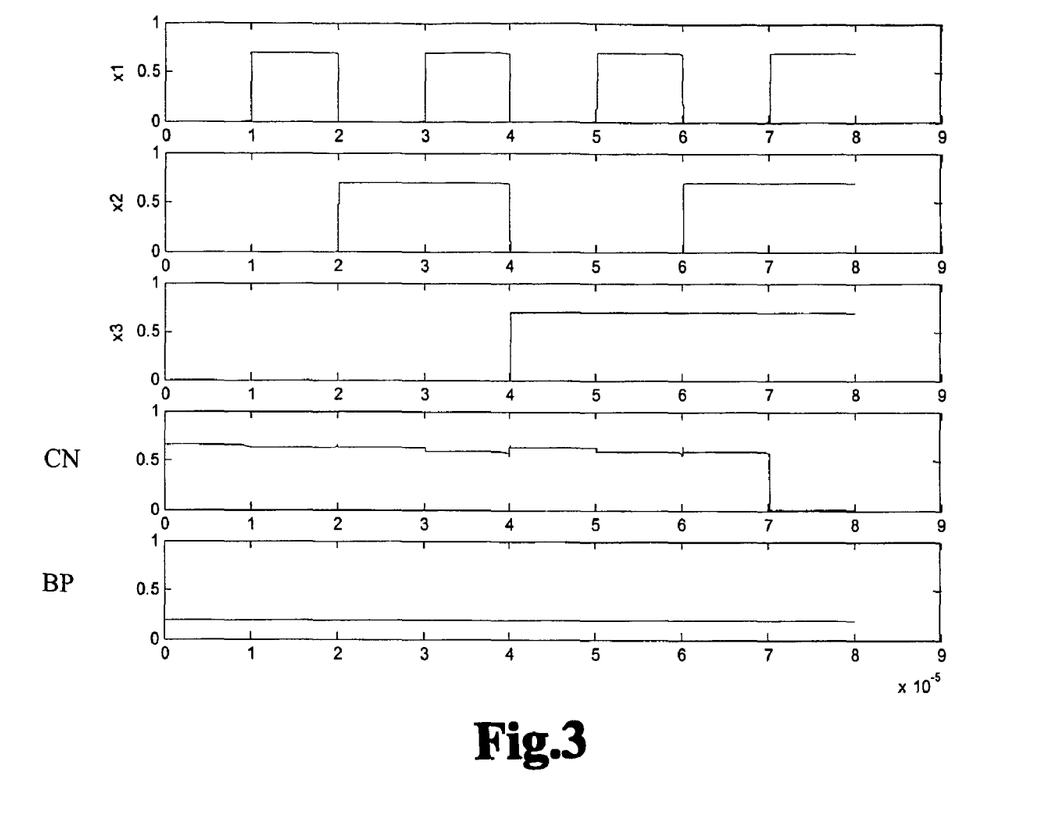
FIG. 3-5 illustrate the result of AimSpice-simulations of the circuit element, where the horizontal axis indicates time and the vertical axis indicates voltage in volts.
Figure 4:
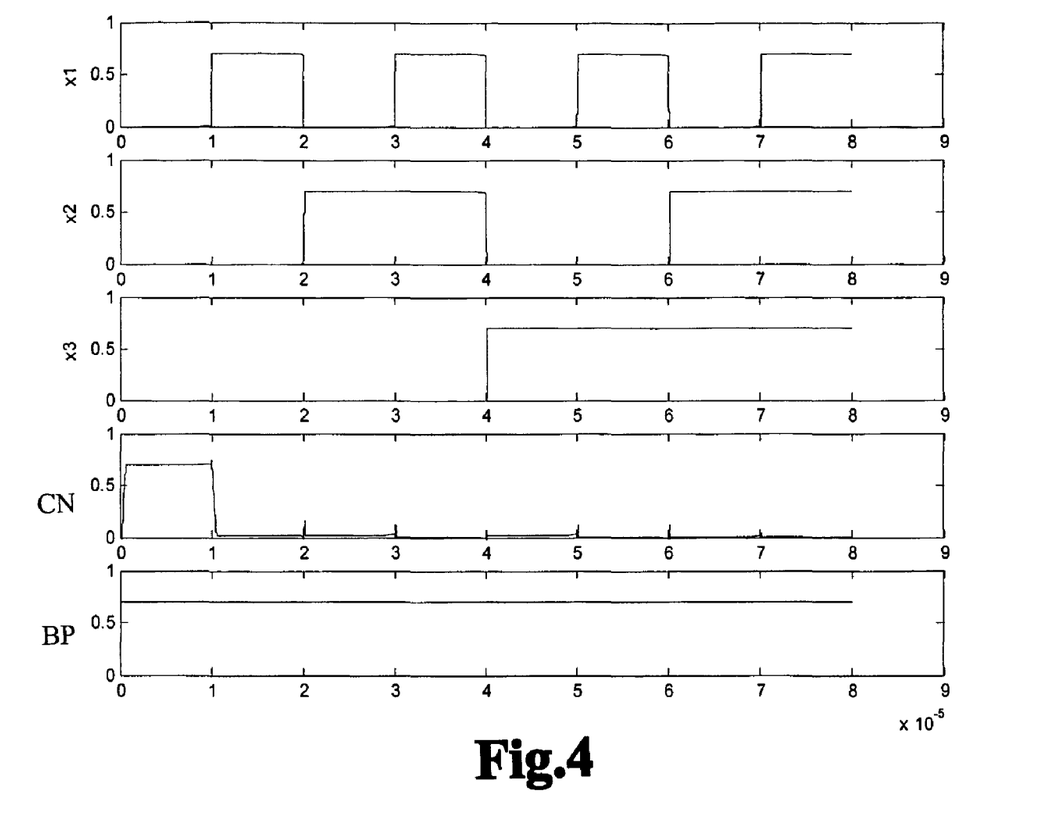
Figure 5:
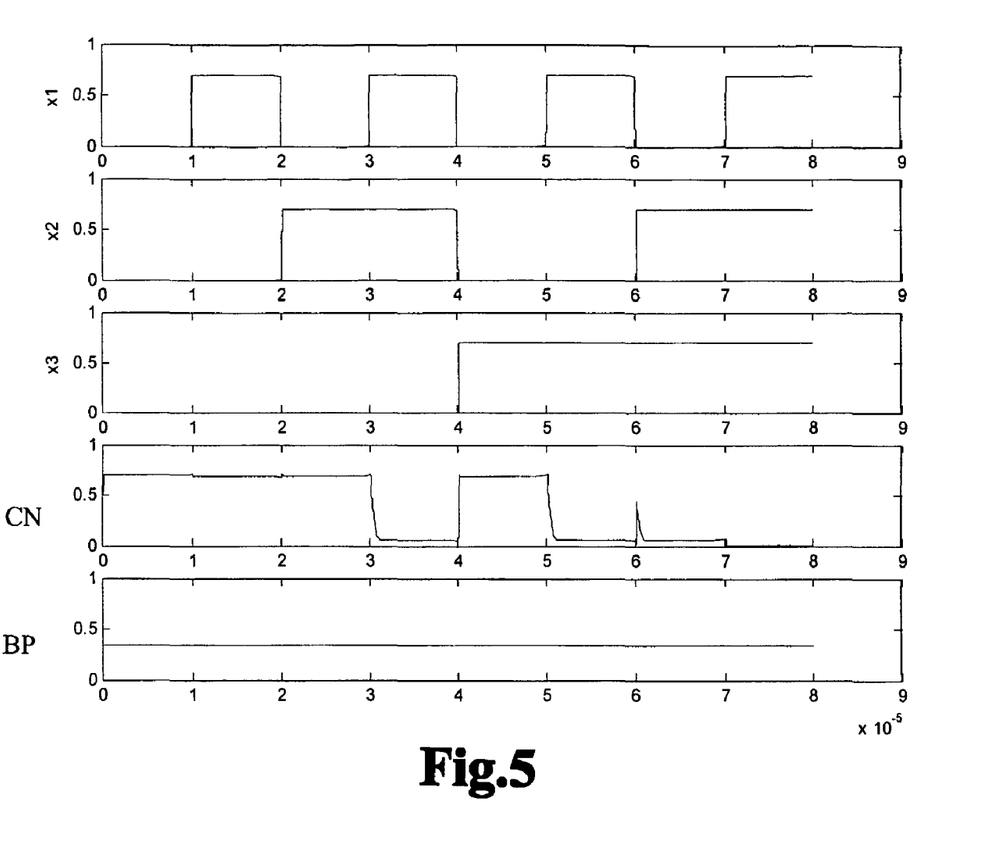

These simulations are carried out by means of the computer program AimSpice, and the simulation results are fed into the computer program MatLab, for presentation of the results in the form of graphs, as shown in FIGS. 3, 4, and 5.

In FIG. 3, the voltage level of the control terminal BP is 0.2 V. The result of the simulation is presented as logic values in the following table:

TABLE 1

| | NAND-function | | | |
|---|---|---|---|---|
| Time [×10⁻⁵ s] | $X_1$ | $X_2$ | $X_3$ | CN |
| 0.5 | 0 | 0 | 0 | 1 |
| 1.5 | 1 | 0 | 0 | 1 |
| 2.5 | 0 | 1 | 0 | 1 |
| 3.5 | 1 | 1 | 0 | 1 |
| 4.5 | 0 | 0 | 1 | 1 |
| 5.5 | 1 | 0 | 1 | 1 |
| 6.5 | 0 | 1 | 1 | 1 |
| 7.5 | 1 | 1 | 1 | 0 |

As is apparent from the table, the output terminal has logic value 0, only when all of the input terminals have logic value 1. This corresponds to a NAND-function.

In FIG. 4, the voltage level of the control terminal BP is 0.7 V. The result of the simulation is shown as logic values in the following table:

TABLE 2

| | NOR-function | | | |
|---|---|---|---|---|
| Time [×10⁻⁵ s] | $X_1$ | $X_2$ | $X_3$ | CN |
| 0.5 | 0 | 0 | 0 | 1 |
| 1.5 | 1 | 0 | 0 | 0 |
| 2.5 | 0 | 1 | 0 | 0 |
| 3.5 | 1 | 1 | 0 | 0 |
| 4.5 | 0 | 0 | 1 | 0 |
| 5.5 | 1 | 0 | 1 | 0 |
| 6.5 | 0 | 1 | 1 | 0 |
| 7.5 | 1 | 1 | 1 | 0 |

As is apparent from table 2, the output terminal has logic value 1, only when all the input terminals have logic value 0. This corresponds to a NOR-function.

In FIG. 5, the voltage level of the control terminal BP is 0.342 V. The result of the simulation is shown as logic values in the following table:

TABLE 3

| Time [×10⁻⁵ s] | CARRY'-function | | | |
|---|---|---|---|---|
| | $X_1$ | $X_2$ | $X_3$ | CN |
| 0.5 | 0 | 0 | 0 | 1 |
| 1.5 | 1 | 0 | 0 | 1 |
| 2.5 | 0 | 1 | 0 | 1 |
| 3.5 | 1 | 1 | 0 | 0 |
| 4.5 | 0 | 0 | 1 | 1 |
| 5.5 | 1 | 0 | 1 | 0 |
| 6.5 | 0 | 1 | 1 | 0 |
| 7.5 | 1 | 1 | 1 | 0 |

From table 3, it is apparent that when none, or only one of the inputs has logic value 1, the output terminal has logic value 1. When two or three of the input terminals have logic value 1, the output terminal has logic value 0. This corresponds to a CARRY'-function.

Accordingly, by use of only six transistors, a circuit element that can be reconfigured in real time between logic NAND3, logic NOR3, or CARRY', depending on the signal of the control terminal BP, is achieved in this example. Of course, a separate control circuit is required for the control terminal BP, but the same control circuit can sumultaneously control many such circuit elements on one chip, so that the total reduction in the number of transistors can be substantial.

Example 2

The Circuit Element as a Full Adder

Figure 2:
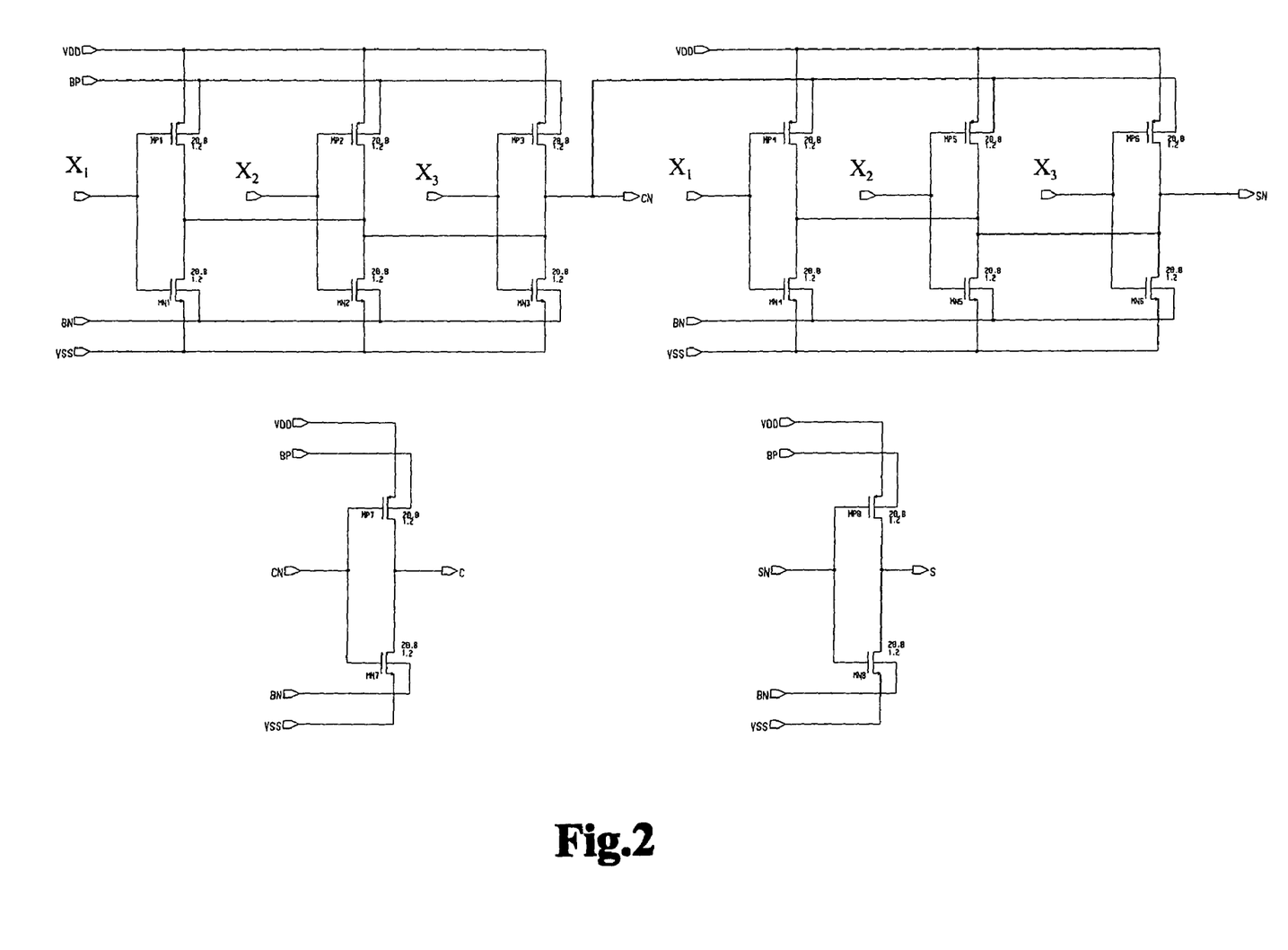
FIG. 2 illustrates a circuit diagram of an embodiment used as a full adder.

The following example is described with reference to FIG. 2. A full adder is obtained by connecting two circuit elements as described above in series as is described below. All of the input terminals $x_1$, $x_2$, $X_3$, the terminal for the lower voltage level $V_{SS}$, and the terminal for the upper voltage level $V_{DD}$, as well as the control terminal BN of both circuit elements, are connected as described above. The circuit elements are connected in series, in such a way that the output terminal CN of the first circuit element is connected to the control terminal BP of the second circuit element. The first circuit element comprises the transistor pairs $MP_{1-3}$, $MN_{1-3}$, whereas the second circuit element comprises the transistor pairs $MP_{4-6}$, $MN_{4-6}$.

The control terminal BP of the first circuit element is as described above. An output terminal SN of the second circuit element is connected to the drain node of the PMOS transistor $MP_6$, and to the drain node of the NMOS transistor $MN_6$, in the same way as the output terminal CN is connected to the drain nodes of $MP_3$ and $MN_3$.

Two additional transistor pairs are used to achieve a full adder according to the invention. The output terminal CN of the first circuit element is connected both to the gate node of the PMOS transistor $MP_7$ and to the gate node of the NMOS transistor $MN_7$. Furthermore, the output terminal SN of the second circuit element is connected both to a gate node of a PMOS transistor $MP_8$ and to a gate node of a NMOS transistor $MN_8$. The voltage supply for these four transistors occurs by means of the voltage terminals $V_{SS}$ and $V_{DD}$, and the control terminal BN is connected to the well nodes of the NMOS transistors $MN_7$ and $MN_8$, and the control terminal BP is connected to the well nodes of the PMOS transistors $MP_7$, and $MP_8$, in the same way as described above.

An output terminal C is connected to the drain terminals of the transistor pair $MP_7$ and $MN_7$, and an output terminal S is connected to the drain terminals of the transistor pair $MP_8$ and $MN_8$.

The operation of the full adder according to the invention will be described with reference to FIGS. 2 and 6. In the three upper graphs of FIG. 6, the voltage levels $V(X_1)$, $V(X_2)$, and $V(X_3)$ are shown as functions of time. In the fourth graph, the voltage levels V(CN) and V(C) are shown, and in the lowest graph, the voltage levels V(SN), V(BP), and V(VS) are shown as a function of time, as a result of the changes in the voltage levels $V(X_1)$, $V(X_2)$, and $V(X_3)$.

In this example, $V_{DD}$ is 0.6 V and $V_{SS}$ is 0 V, which means (in this case) that the transistors operate in the subthreshold area. Logic 0 is represented by a voltage level in the range of 0-0.25 V, and logic 1 is represented by a voltage level in the range of 0.3-0.6 V. The voltage level of the control terminal BN is 0 V, and the voltage level of the control terminal BP is 0.3 V, as shown in the lowest graph of FIG. 6.

Figure 6:
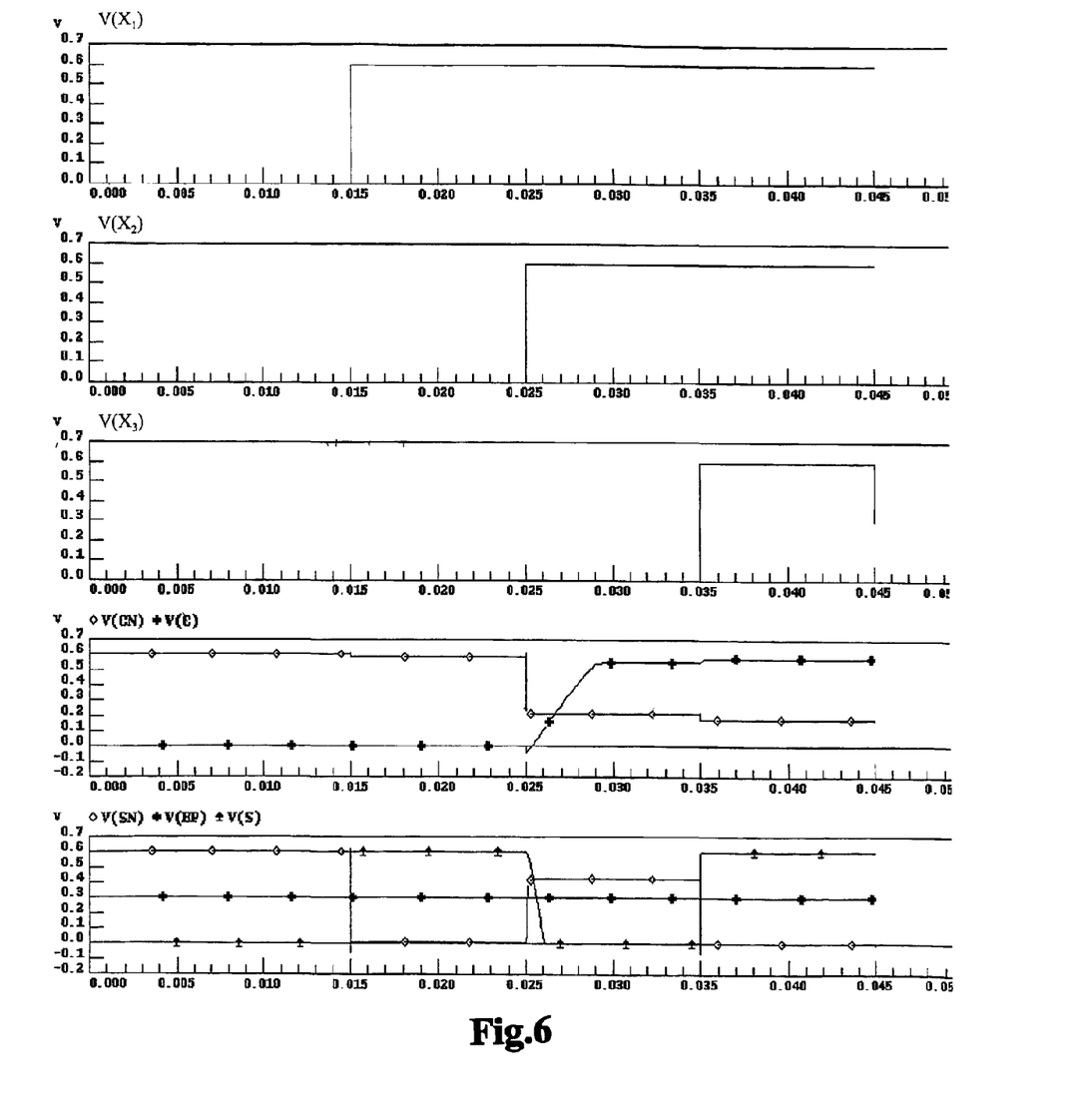
FIG. 6 illustrates the result of an ELDO-simulation of the circuit element/full adder.

The simulation results shown in FIG. 6 are represented below in the form of a table:

TABLE 4

| Time [ms] | Full adder | | | | | | |
|---|---|---|---|---|---|---|---|
| | In $X_1$ | In $X_2$ | In $X_3$ | SUM S | CARRY C | SUM' SN | CARRY' CN |
| 0.010 | 0 | 0 | 0 | 0 | 0 | 1 | 1 |
| 0.020 | 1 | 0 | 0 | 1 | 0 | 0 | 1 |
| 0.030 | 1 | 1 | 0 | 0 | 1 | 1 | 0 |
| 0.040 | 1 | 1 | 1 | 1 | 1 | 0 | 0 |

In this circuit, all of the transistor pairs are alike. Hence, it does not matter which of the input signals are low or high. As is apparent from the table, when all of the input terminals are logic 0, the sum, represented by the output terminal S, and carry, represented by the output terminal C, is 0. If one input terminal is logic 1, then S is 1 and C is 0. If two input terminals are 1, then S is 0 and C is 1. If all the input terminals are 1, then both S and C are 1. With that, the full adder function is shown.

When configured for the full adder function, it is known by a person skilled in the art, that by fixing one of the inputs at 0 or 1, NAND2 and NOR2 can be achieved, and by short circuiting all of the inputs, INVERT can be achieved, with the first circuit element of example two. This signal would then be provided on the CARRY' terminal. At the same time the CARRY terminal would provide OR2, AND2 and BUFFER function, respectively.

From the examples above, it is illustrated that the circuit element according to the invention (shown in FIG. 1) has multiple fields of application, both when used solely and when a plurality are used together. It is known that transistors operating in the subthreshold area have very low power consumption per transistor. With the circuit element, a circuit with a range of application fields is achieved. The circuit element comprises very few transistors, which will contribute to a reduction in power consumption. Also achieved with the circuit element, is that very little wiring is required. This results in the circuit requiring less chip area, and the probability of production errors is also reduced. In addition, a reconfigurable circuit element is achieved, which means that the function of the circuit element can be reconfigured when desired, between different logic functions. This can result in a total reduction of chip area in a large, complex chip, which comprises such circuit elements.

In the examples, it is shown that the input terminals have two logic values, 0 or 1. It is naturally also possible to use this circuit with more discreet levels on the input terminals, as indicated by equation [1].

A person skilled in the art will be able to make variations to the present invention in multiple ways, within the scope of the claims.

The invention claimed is:

1. Circuit element, comprising:
   N pairs of transistor units, each pair including a first (MP) and a second (MN) complementary transistor unit with at least four nodes, where the first transistor unit includes
     a first node, which is connected to an upper ($V_{DD}$) voltage level,
     a second node connected to the second node of a complementary transistor unit,
     an input node that controls the current through, and the voltage over the first and second node,
     a control input node that controls the current/voltage characteristics of the transistor unit, and
   the second transistor unit includes
     a first node, which is connected to a lower ($V_{SS}$) voltage level,
     a second node connected to the second node of a complementary transistor unit,
     an input node that controls the current through, and the voltage over the first and second node,
     a control input node that controls the current/voltage characteristics of the transistor unit,
   where the second nodes of the respective paired transistor units also are connected to each other, and the upper and lower voltage levels ($V_{DD}$, $V_{SS}$) are such that the transistor units operate in subthreshold,
   N input terminals ($X_1$, $X_2$, ... $X_N$) connected to input nodes of the respective paired transistor units,
   an output terminal (CN) connected to input the interconnected second nodes of the paired transistor units, and
   at least one of the following:
     a control terminal (BP) connected to the control input nodes of the first transistor units, of the N paired transistors,
     a control terminal (BN) connected to the control input nodes of the second transistor units, of the N paired transistors,
   where N is an integer.

2. Circuit element according to claim 1, characterized in that the first transistor units are PMOS transistors, and the second transistors are NMOS transistors.

3. Circuit element according to claim 1, characterized in that the circuit element can be reconfigured in real time, between a logic NAND-function, a logic NOR-function, and a CARRY'-function, by a change in the voltage level of at least one of the control terminals (BN, BP).

4. Circuit element according to claim 1, characterized in that $2 \leq N \leq 8$, preferably $2 \leq N \leq 4$.

5. Threshold element circuit with full adder function, characterized in that the circuit comprises two circuit elements according to claim 1, in which circuit elements N is 3, where the output terminal (CN) of the first circuit element is connected to the control terminal (BP) for the PMOS well terminals of the second circuit element, and where the first output, in the form of the carry terminal (C), is connected to the second nodes of a pair of transistor units, where the input terminal of this transistor unit pair is connected to the output terminal (CN) of the first circuit element, and where the second output, in the form of the sum terminal (S), is connected to the second nodes of a pair of transistor units, where the input terminal of this transistor unit pair is connected to the output terminal (SN) of the second circuit element.

* * * * *